United States Patent [19]

Matsushita et al.

[11] 4,176,372
[45] Nov. 27, 1979

[54] SEMICONDUCTOR DEVICE HAVING OXYGEN DOPED POLYCRYSTALLINE PASSIVATION LAYER

[75] Inventors: Takeshi Matsushita, Sagamihara; Hisao Hayashi, Atsugi; Teruaki Aoki, Tokyo; Hisayoshi Yamoto, Hatano; Yoshiyuki Kawana, Atsugi, all of Japan

[73] Assignee: Sony Corporation, Tokyo, Japan

[21] Appl. No.: 857,284

[22] Filed: Dec. 5, 1977

Related U.S. Application Data

[63] Continuation of Ser. No. 682,449, May 3, 1976, abandoned, which is a continuation-in-part of Ser. No. 561,532, Mar. 24, 1975, Pat. No. 4,014,037.

[30] Foreign Application Priority Data

Mar. 30, 1974 [JP] Japan .................................. 49-36175
May 7, 1975 [JP] Japan .................................. 50-54943

[51] Int. Cl.² .......................................................... H01L 29/34
[52] U.S. Cl. ........................................ 357/52; 357/23; 357/42; 357/53; 357/54; 357/59; 357/86
[58] Field of Search ........................ 357/23, 42, 52, 53, 357/54, 59, 86

[56] References Cited

U.S. PATENT DOCUMENTS

| | | | |
|---|---|---|---|
| B 535,209 | 3/1976 | Kajiwara et al. | 357/59 |
| 3,731,161 | 5/1973 | Yamamoto | 357/23 |
| 3,878,549 | 4/1975 | Yamazaki et al. | 357/54 |
| 3,925,107 | 12/1975 | Goula et al. | 357/52 |
| 3,934,399 | 1/1976 | Nishimura et al. | 357/42 |
| 3,971,061 | 7/1976 | Matsushita et al. | 357/59 |
| 3,977,019 | 8/1976 | Matsushita et al. | 357/59 |

FOREIGN PATENT DOCUMENTS 300472  4/1968  Sweden ................................. 357/53

OTHER PUBLICATIONS

P. Richman, "MOS Field-Effect Transistors and Integrated Circuits," ©1973, Wiley-Interscience, TK 7871, 85, R466, pp. 17-33, 137-141.

Primary Examiner—Joseph E. Clawson, Jr.
Attorney, Agent, or Firm—Hill, Van Santen, Steadman, Chiara & Simpson

[57] ABSTRACT

A polycrystalline layer is formed as a passivation layer on a monocrystalline semiconductor substrate, the polycrystalline layer containing oxygen in the range between 2 to 45 atomic percent. The density of surface states between the surface of said substrate and the polycrystalline silicon layer is less than $10^{10}/cm^2 \cdot eV$ at the middle portion of a forbidden band, and the interface density of fixed charge in the polycrystalline layer is less than $10^{10}/cm^2$.

2 Claims, 19 Drawing Figures

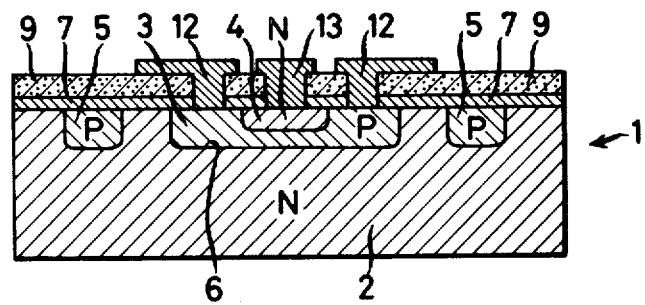
FIG.1F
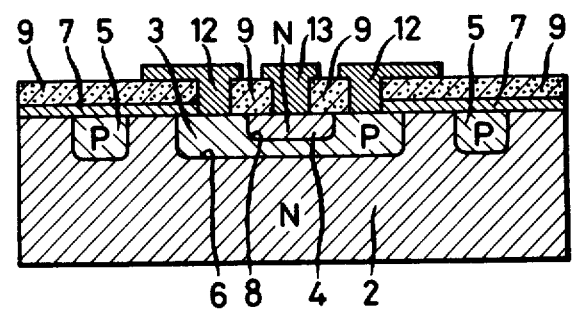
FIG. 2
FIG. 3
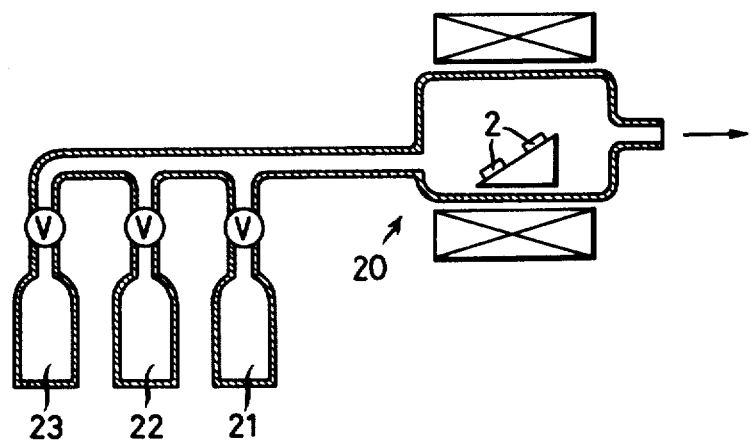

SEMICONDUCTOR DEVICE HAVING OXYGEN DOPED POLYCRYSTALLINE PASSIVATION LAYER

CROSS REFERENCE TO RELATED APPLICATION

This is a continuation, of application Ser. No. 682,449, filed May 3, 1976 abandoned and a continuation-in-part of Ser. No. 561,532, filed Mar. 24, 1975, now Pat. No. 4,014,037.

Another related application is our copending application, Ser. No. 624,889, filed Oct. 22, 1975 now abandoned, and assigned to the same assignee as the present invention.

BACKGROUND OF THE INVENTION

This invention relates to a semiconductor device having a surface passivation layer formed on one major surface of a semiconductor substrate. In the past, surface passivation layers have been generally formed by the vapor growth method or by thermal oxidation.

The most common form of passivation layer in the past has been a silicon dioxide deposited layer on a surface of a semiconductor substrate, the substrate usually being monocrystalline silicon. More recently, it was suggested that the passivation characteristics could be improved by depositing a second layer of silicon nitride on the silicon dioxide layer.

In our copending application, Ser. No. 561,532, it was disclosed that a greatly improved passivation layer could be obtained by depositing a polycrystalline layer directly on the surface of the substrate, which polycrystalline layer contained oxygen in the range between 2 to 45 atomic percent. The silicon dioxide layer would then be deposited on the polycrystalline layer.

In our copending application, Ser. No. 624,889, filed Oct. 22, 1975, we disclosed a semiconductor device in which a first layer of polycrystalline silicon containing oxygen in the range of between 2 to 45 atomic percent, then a layer of polycrystalline containing nitrogen doping of more than 10 atomic percent, and finally covering the nitrogen doped polycrystalline layer with a silicon dioxide layer. It was noted that a nitrogen doped polycrystalline film has much higher resistance to moisture than does either the oxygen doped polycrystalline layer or the silicon dioxide layer.

When only a pure polycrystalline film is used as a passivation layer, its electrical resistance is not high enough to prevent leakage near the surface. In this sense, a polycrystalline layer is not as good as a silicon dioxide layer. All silicon atoms have surface states (sometimes commonly referred to as dangling bonds) at the interface surface, between the substrate and the passivating layer, and this causes some leakage current due to generation-recombination, which leakage current is in addition to the leakage current due to the relatively low resistivity of the polycrystalline layer.

Another type of passivation layer which has been suggested in the past is one in which an amorphous film is used instead of a polycrystalline layer, but this type film has the same objectionable characteristics as a $SiO_2$ film.

SUMMARY OF THE INVENTION

It is an object of the present invention to provide a novel passivation layer which is a polycrystalline silicon layer containing oxygen atoms in the range between 2 and 45 atomic percent formed on a semiconductor single crystal substrate in which the density of surface states between the surface of the substrate and the polycrystalline silicon layer is less than $10^{10}$ cm$^{-2}$.eV$^{-1}$ at the middle portion of the forbidden band and having the interface density of fixed charge in the polycrystalline silicon layer less than $10^{10}$ cm$^{-2}$. While some improvement has been found where the density of surface states is on the order of $10^{13}$ cm$^{-2}$.eV$^{-1}$, it has been determined that the number of surface states should be less than $10^{10}$ cm$^{-2}$.eV$^{-1}$ to get the best results.

Another object of this invention is to provide a novel semiconductor device which has a relatively high breakdown voltage of a PN junction rising to the surface of the substrate upon which the passivation layer or layers is deposited.

A still further object of this invention is to provide a novel structure which prevents the undesirable influences of external electrical fields, reduces reverse leakage currents, improves the noise characteristic and prevents thermal distortion.

A further object of this invention is to provide a novel semiconductor device suitable as a semiconductor element or a group of elements in an integrated circuit such as diodes, transistors, MOS capacitors, which have one or more PN junctions reverse biased in operation.

The process of forming the device is performed under such conditions that an amorphous film is not formed, but in which a polycrystalline film is formed which is oxygen doped so that the polycrystalline film contains 2 to 45 atomic percent of oxygen. The oxygen atoms are uniformly distributed in the grains. Substantially no silicon dioxide layer exists between the grains and the monocrystalline semiconductor substrate. The grain size of the polycrystalline layer is less than 1000 Å. The polycrystalline layer is formed by chemical vapor deposition at a temperature of approximately 650° C.

BRIEF DESCRIPTION OF THE DRAWINGS

FIGS. 1A to 1F illustrate the sequence of steps involved in the manufacture of a transistor device in accordance with this invention;

FIG. 2 is a cross sectional view of a transistor according to one embodiment of this invention;

FIG. 3 is a sketch of a chemical vapor deposition apparatus used in this invention;

DESCRIPTION OF THE PREFERRED EMBODIMENTS

One embodiment of this invention as applied to a transistor will now be described with reference to the drawings.

First, a method for manufacturing the transistor 1, will be described with reference to FIGS. 1A to 1F.

Figure 1A:
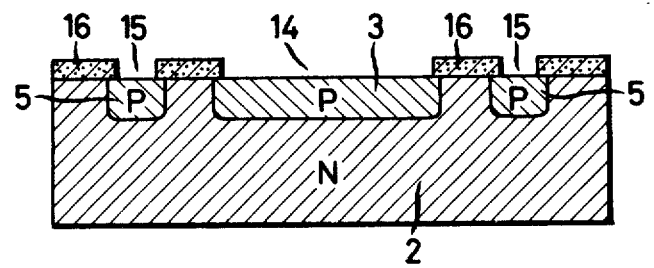
Figure 1B:
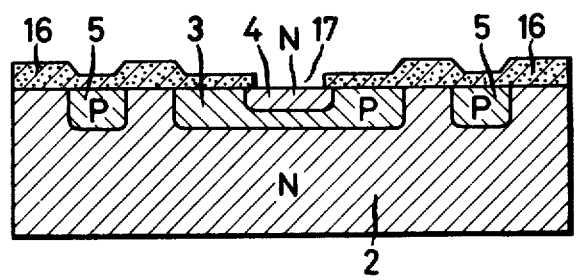

A semiconductor substrate 2 of N-type silicon with a relatively low concentration of impurity or an N-type semiconductor substrate with a higher impurity concentration but having an N-type semiconductive region with a relatively low concentration of impurity epitaxially grown on the N-type semiconductor substrate can be used. A SiO$_2$ layer 16 is formed on the semiconductor substrate 2 by a conventional thermal oxidation method or by the vapor growth method. Openings 14 and 15 are formed in the SiO$_2$ layer. P-type impurities are diffused into the semiconductor substrate 2 through these openings to form a P-type semiconductive region 3 as a base region and a P-type semiconductive region 5 as a guard ring. During the diffusion operation, SiO$_2$ layers are formed in the openings by thermal oxidation. As shown in FIG. 1B, opening 17 is formed in the SiO$_2$ layer overlying the P-type semiconductive region 3. N-type impurities are diffused into the P-type semiconductive region 3 to form the N-type semiconductive region 4 therein.

Figure 1C:
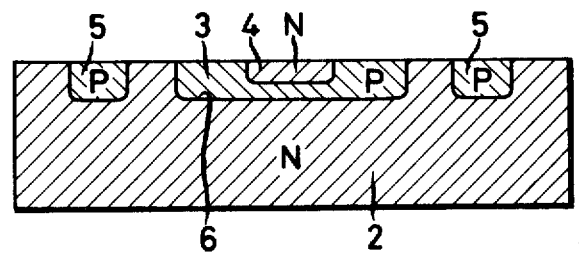
Figure 1D:
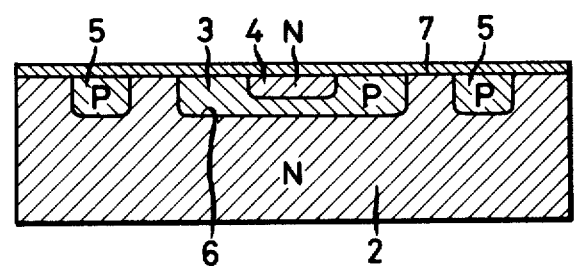

As shown in FIG. 1C, the SiO$_2$ layer is removed from the semiconductor substrate 2 by an etching operation. A polycrystalline layer of silicon containing a small quantity of oxygen atoms is formed on the exposed semiconductor substrate 2 to form the polycrystalline silicon layer 7 containing oxygen. It will be noted that the various PN junctions extend up to one planar surface of the substrate.

The polycrystalline silicon layer 7 is so formed as to have a predetermined minimum thickness. This is done by a vapor growth method so as to cover the exposed part of the PN-junction 6, as well as to cover the other PN junctions. The thickness of the polycrystalline silicon layer 7 is preferably in the range of 1000 Å to 2μ. A better passivation effect can be obtained for thickness over 5000 Å. However, with thicknesses over 2μ, the corners of the electrodes are more apt to be broken. The polycrystalline silicon layer 7 contains oxygen in the range of 2 to 45 atomic percent. From the view point of passivation, it is preferable that the thickness of the polycrystalline silicon layer 7 be as large as possible within the above described limits. The polycrystalline silicon layer 7 is wide enough to cover not only the exposed part of the PN junction 6 but also the extended area of the depletion layer formed when the PN junction 6 is reverse-biased.

Figure 1E:
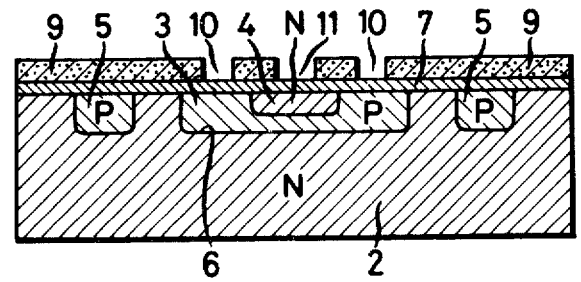

As shown in FIG. 1E, SiO$_2$ layers 9 are formed on the polycrystalline silicon layer 7, by the vapor growth method. Openings 10 and 11 are formed in the SiO$_2$ layers 9 by the conventional photoetching method. The openings 10 and 11 are filled with a base electrode 12 and an emitter electrode 13, as shown in FIG. 1F.

A p-type semiconductive region 5 which serves as a guard ring is formed around the P-type semiconductive region 3 by the diffusion method. A depletion layer is formed adjacent to a PN junction 6 between the p-type semiconductive region 3 and the semiconductor substrate 2 when a reverse bias voltage is applied to the PN junction 6. The P-type semiconductive region 5 is so far from the P-type semiconductive region 3 that the depletion layer thus formed can extend to the P-type semiconductive region 5. The combination of such an arrangement and the polycrystalline silicon layer, results in the breakdown voltage of the PN junction 6 being greatly raised.

An important aspect of the present invention is to so control the relationship between the concentration of oxygen and the flow ratio of N$_2$O to SiH$_4$, the temperature at which the deposition of the polycrystalline layer is made, the rate of growth of the polycrystalline layer, that the density of surface states between the surface of the substrate and the polycrystalline layer is less than $10^{10}$ cm$^{-2}$.eV$^{-1}$ at the middle portion of the forbidden band and that the fixed charge in the polycrystalline layer is less than $10^{10}$ cm$^{-2}$. The temperature for the chemical vapor deposition should preferably be approximately 650° C. This will give a grain size of the crystals forming the polycrystalline layer of less than 1000 Å.

Another embodiment is shown in FIG. 2. In FIG. 2, the PN junction 8 is directly covered by SiO$_2$ layer 9. The reason the SiO$_2$ layer 9 is coated directly onto the exposed part of the PN junction 8, is that h$_{FE}$ can be increased during forward bias of the PN junction 8.

In the above-mentioned embodiments, an intermediate layer having good moisture-resistivity, as for example, an aluminum layer, may be formed between the polycrystalline silicon layer and the SiO$_2$ layer.

The formation of the polycrystalline silicon layer 7 will be described with reference to FIG. 3. A mixed gas of monosilane SiH$_4$ from tank 21 and dinitrogen monoxide N$_2$O from tank 22 are fed through suitable valves into the vapor growth apparatus 20 which contains the semiconductor substrates 2. N$_2$ gas from tank 23 which serves as a carrier gas is fed through the apparatus at a constant flow rate of 25 l/min. and the monosilane SiH$_4$ is fed into the apparatus at a constant flow rate of 30 cm$^3$/min. The flow rate of the N$_2$O is varied at rates of 0, 10, 20, 30, 150, 300 and 1200 cm$^3$/min.

The semiconductor substrate is heated to a temperature in the range of 600° to 750° C., but preferably to 650° C. for the growth of the layer in the apparatus. Since the growing temperature is relatively low, there is little possibility that impurities in the semiconductor substrate will be doped into the polycrystalline silicon layer 7.

For temperatures below 600° C., the growth rate is too slow for practical manufacturing. Also at temperatures above about 800° C., the growth rate is too high and control of the thickness of the polycrystalline silicon layer 7 is very difficult and also the grain size becomes too large for the desirable characteristics.

Polycrystalline silicon is deposited onto the semiconductor substrate by the thermal decomposition of monosilane. At the same time, oxygen derived from N$_2$O is nearly uniformly mixed into the polycrystalline silicon. Many different polycrystalline silicon layers 7 containing different amounts of oxygen can be formed on the semiconductor substrates 2, corresponding to different flow rates such as a flow rate of 0, 10, 20, 30, 150, 300 and 1200 cm$^3$/min. of the N$_2$O gas. Then the SiO$_2$ layers 9 are formed on the polycrystalline silicon layers 7.

Preferable ratios of N₂O to SiH₄ for different concentrations of oxygen doping are shown in the table set forth below:

TABLE 1

| Flow Rates | | Ratio | Concentration of Oxygen |
|---|---|---|---|
| N₂O | SiH₄ | N₂O/SiH₄ | (atomic %) |
|  |  | 0 | 0 to 1.0 |
| 5 | 50 | 1/10 | 7 |
| 10 | 50 | 1/5 | 14 |
| 25 | 50 | 1/2 | 26 |
| 50 | 50 | 1/1 | 30 |
| 100 | 50 | 2/1 | 36 |
| 250 | 50 | 5/1 | 45 |
| 500 | 50 | 10/1 | 52 |

Figure 4:
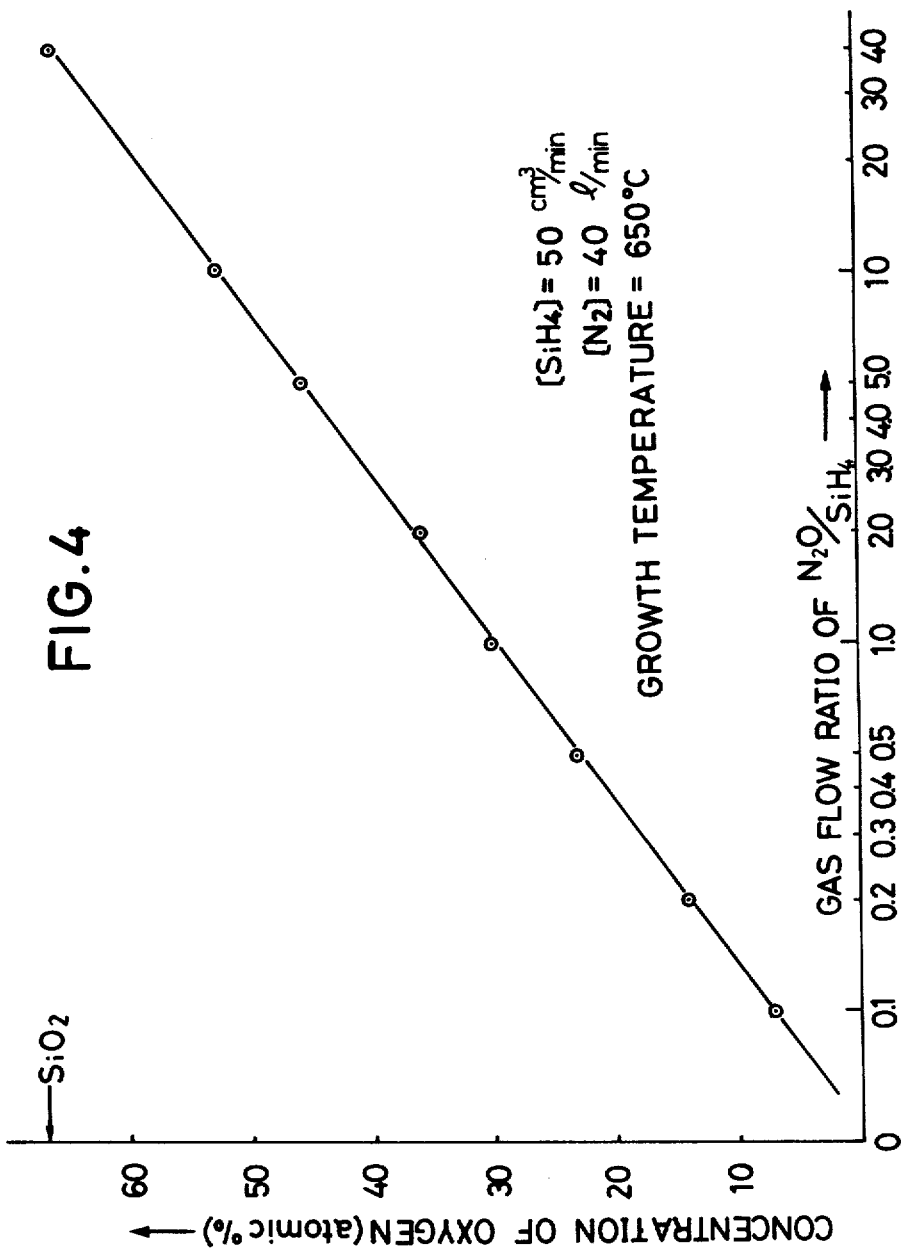
FIG. 4 is a graph comparing oxygen concentration with the ratio of $N_2O/SiH_4$.

It should be noted that the concentration of atomic percent oxygen increases as the logarithm of the ratio of N₂O/SiH₄. This is illustrated in FIG. 4.

Figure 5:
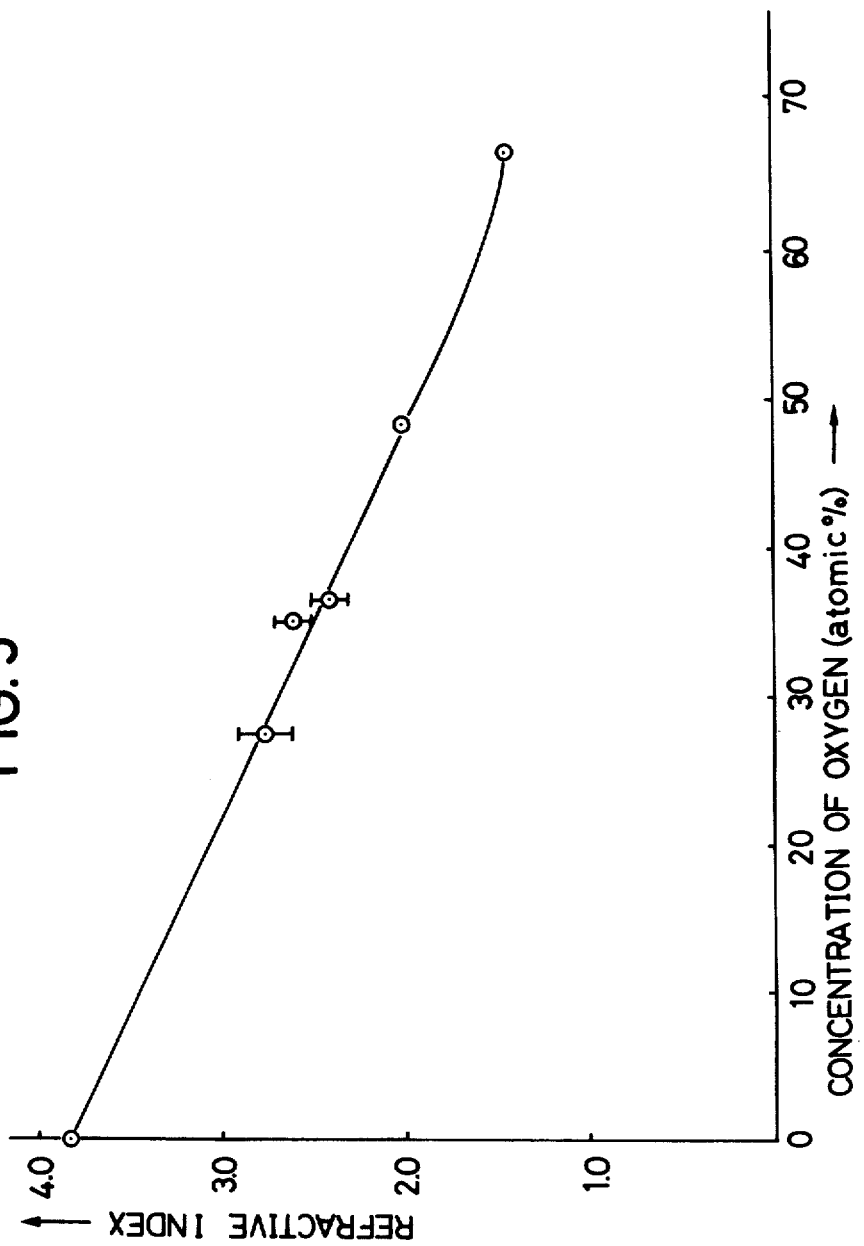
FIG. 5 is a graph showing the relationship of the oxygen concentration to the reflective index.

FIG. 5 of the drawings is a graph illustrating the relationship of the reflective index to the oxygen concentration in the oxygen doped polcrystalline layer.

Figure 6:
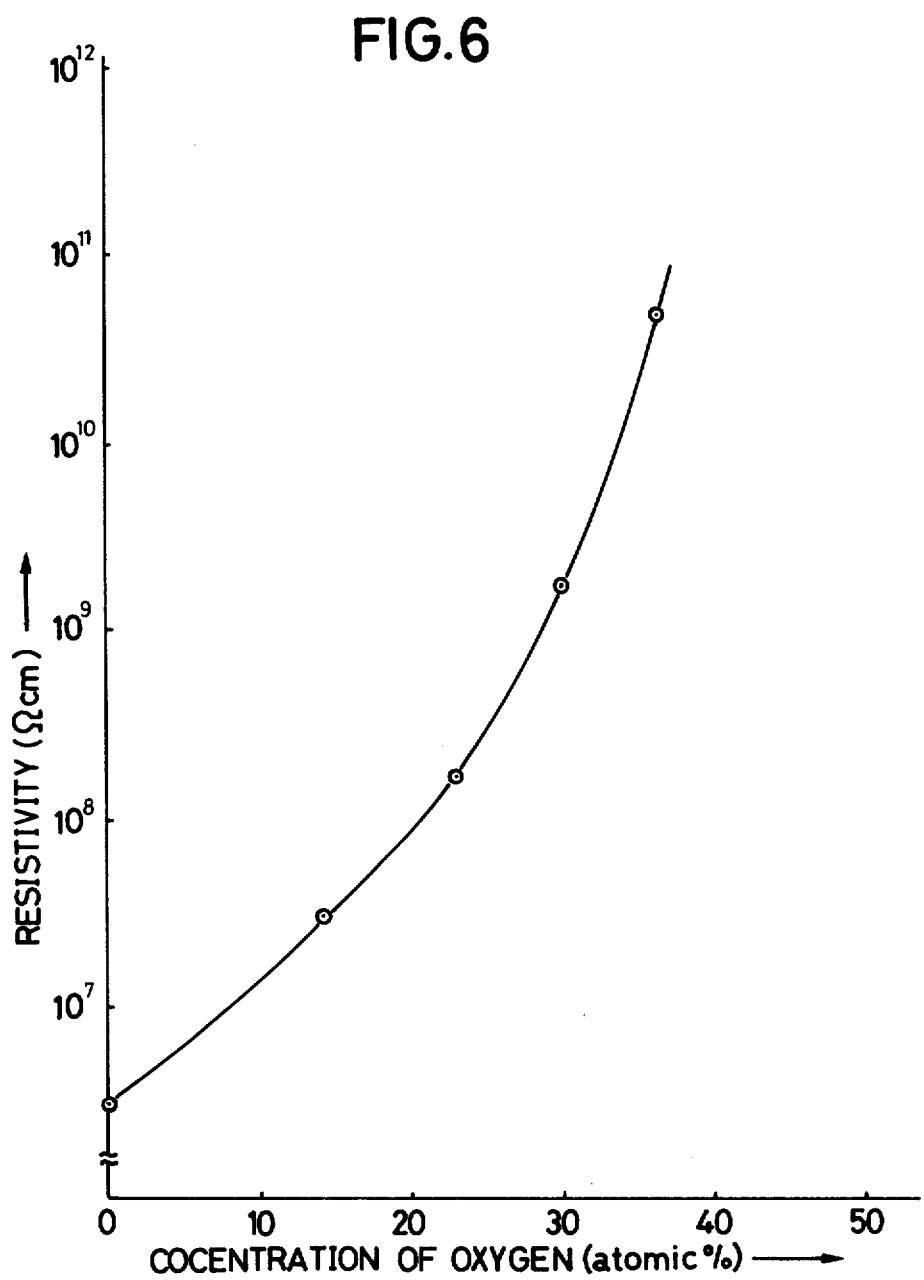
FIG. 6 is a graph showing the relationship of the oxygen concentration to resistivity.

FIG. 6 is a graph illustrating the resistivity of the oxygen doped polycrystalline layer with respect to the oxygen concentration.

Figure 7:
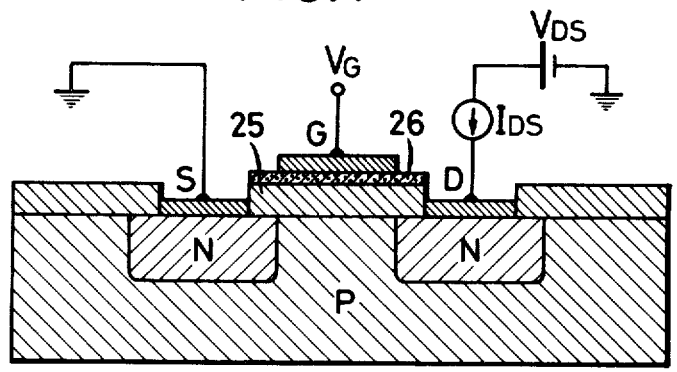
FIG. 7 is a cross sectional view of a field effect transistor embodying the present invention.

FIG. 7 is a sectional view of a field effect transistor comprising a substrate 24 of silicon having p type impurities. An n type source region 25 and an n type drain region 26 are diffused into one planar face of the substrate. An oxygen doped polycrystalline layer 27 having oxygen in the range of 2 to 45 atomic percent is formed on the planar surface of the substrate. A source electrode 28 is formed in an opening through the polycrystalline layer 27 and a drain electrode 29 is formed through the polycrystalline layer. A silicon dioxide layer 30 is formed on the surface of that portion of the polycrystalline layer 27 which lies above the substrate portion lying between the source 25 and the drain 26. A gate electrode 30 lies on the silicon dioxide layer and is provided with a gate biasing terminal $V_G$. A drain-source biasing voltage is provided by a voltage source 31 to provide a bias between the drain and source of $V_{DS}$. Current flowing between the source and drain is indicated as 32. The negative side of the voltage source 31 and the source 25 are grounded as shown.

Figure 8:
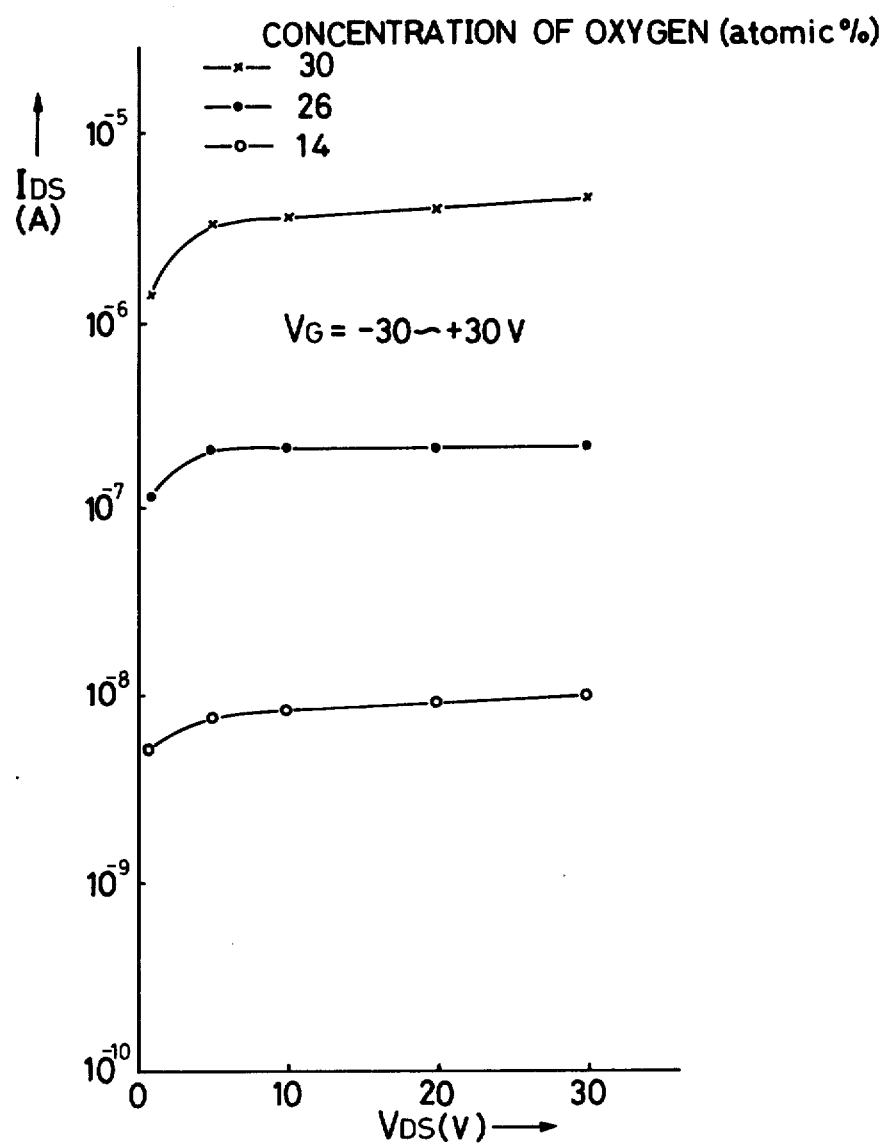
FIG. 8 is a graph showing the relationship between $V_{DS}(V)$ and the drain to source current for different selected oxygen concentrations.

The graph shown in FIG. 8 illustrates the relationship between $I_{DS}$ and $V_{DS}$ for different amounts of oxygen concentration in the polycrystalline silicon layer. Three different levels of concentration are shown, namely, where the oxygen doping is 14 atomic percent, where it is 26 atomic percent, and where it is 30 atomic percent. As shown, the drain to source current is greater with a gate voltage of −30 to +30 volts with an oxygen concentration of 30 than it is with either a concentration of 26 or a concentration of 14.

Figure 9:
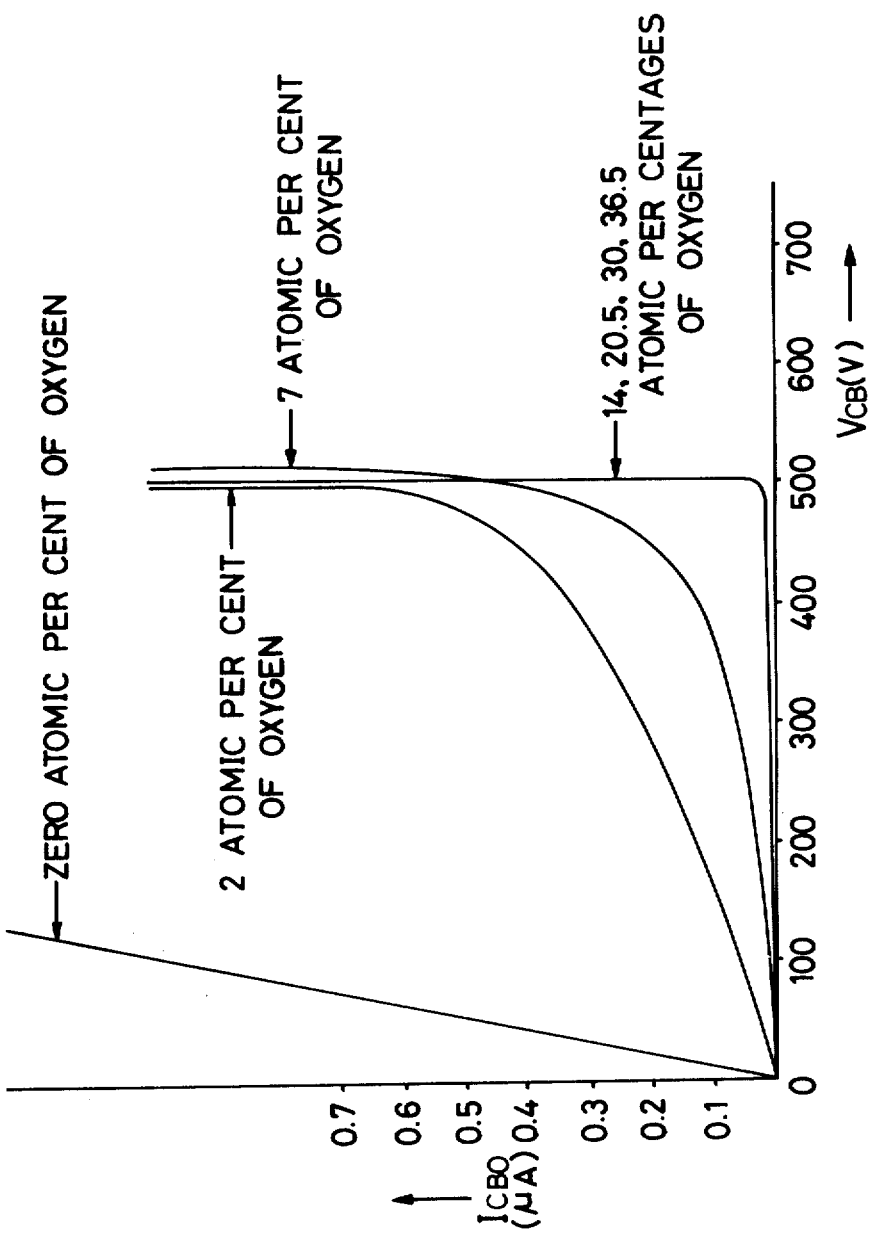
FIG. 9 is a graph indicating the results of tests for various transistors which have passivation layers and is a plot of $I_{CBO}$ (leakage current collector to base) vs. $V_{CB}$ (volts collector to base)

FIG. 9 shows the relationship between the leakage current collector to base as a function of the collector to base voltage. In this graph, the graph line 33 shows that the leakage current rises very rapidly as the collector to base current increases when there is no oxygen doping in the polycrystalline layer. Graph line 34 shows that even at 2 atomic percent, the leakage current is greatly reduced. Graph line 35 shows that with 7 atomic percent, the leakage current is still further reduced. Graph line 36 is substantially the same for dopings of 14 atomic percent, 20.5 atomic percent, 30 atomic percent and 36.5 atomic percent. This demonstrates that the leakage current is almost completely reduced up to a breakdown voltage of 500 volts.

In order to better understand the present invention, an explanation will now be made of what is considered to be the underlying characteristics of the present invention. It is well recognized that bulk silicon, for example, has at any surface silicon atoms which are incomplete in that they have surface states or what is frequently referred to as "dangling bonds". Oxygen atoms also have dangling bonds. It is recognized that at the surface of the silicon substrate there are approximately $10^{15}$ dangling bonds per square centimeter without any passivating material. If the surface of the substrate is now oxidized oxygen atoms react to the dangling bonds and may figuratively be said to hook onto the dangling bonds of the silicon atoms at the surface of the silicon substrate on a one-to-one basis. To have a good passivation layer, the density of surface states should be reduced down to at least $10^{12}$, but preferably $10^{10}$. In connection with any semiconductor device having one or more PN junctions, which rise to the surface, which are reverse biased during operation, objectionable leakage current can flow due to the generation-recombination centers and also by the relatively low resistivity of the passivation layer. The generation recombination current is due to some imperfection on the surface. The utilization of oxygen doped polycrystalline semiconductor material results in a marked decrease in the number of dangling bonds at the interface surface of the silicon substrate. This, in turn, reduces the leakage current caused by the generation-recombination current, but oxygen doped polycrystalline has a relatively low resistivity, so there would be a small amount of leakage current when only oxygen doped polycrystalline material is used as a passivation layer.

We have found that certain parameters must be established in producing the passivation layer in order to bring about the highly desirable end result. Particularly, it has been found that the best temperature for effecting the deposition of the polycrystalline semiconductor material should be approximately 650° C., although any temperature within a range between 600° C. and 750° C. Furthermore, it has been found that the layer should be grown at a rate of approximately 500 Å per minute. This means that if a 5000 Å layer is desired, it will take approximately ten minutes to thermally deposit the same.

The above results were verified with an X-ray microanalyzer having a 10 kV acceleration voltage and a 1μ beam diameter. The concentration of atomic percent oxygen increases as the logarithy of the ratio of N₂O/SiH₄. The oxygen is uniformly distributed in all of the polycrystalline silicon layers 7 and was not isolated. The growth rate of the polycrystalline silicon became lower with an increase of the flow rate of N₂O and with a decrease in the growing temperature.

For polycrystalline silicon layers containing oxygen with concentrations less than 2 atomic percent, the property of pure polycrystalline silicon layer was gradually approached. The reverse current flowing through the polycrystalline silicon layer containing oxygen with a concentration less than 2 atomic percent is large. Polycrystalline silicon layers containing oxygen at concentrations over 45 atomic percent displayed instability as great as the SiO₂ layer, according to BT tests (bias and temperature test). Accordingly, the invention requires that the concentration of oxygen be in the range of 2 to 45 atomic percent. From the view point of the below-mentioned properties, particularly the reliability, it is preferable that the concentration of oxygen be in the range of 14 to 35 atomic percent, namely that the ratio of the $N_2O/SiH_4$ be in the range of from 1/5 to 2/1.

Electron diffraction measurements showed that the grain size of the crystal in the polycrystalline silicon layer 7 was about 200 to 300 Å. The grain size of pure polycrystalline silicon ranges from 2 or 3$\mu$ near to the grain size of amorphous substance, depending on the growth condition. Polycrystalline silicon tends to be more amorphous with an increase of the concentration of oxygen. As heretofore pointed out, it is preferable that the mean grain size be under 1000 Å; for example, in the range of 100 to 1000 Å.

In the infrared absorption measurement, an absorption peak at a wave length of 9.0$\mu$ and a wide absorption peak at the wave lengths ranging from 9.3 to 10.0$\mu$ were observed in overlapped form. A single crystal of silicon containing oxygen absorbs infrared rays having wave lengths of 9.0$\mu$, $SiO_2$ absorbs infrared rays having wave length of 9.3$\mu$, and SiO absorbs infrared rays having wave lengths of 10.0$\mu$. The wide absorption peak at the wave lengths ranging from 9.3 to 10.0$\mu$ was shifted from 9.7$\mu$ to 9.4$\mu$ with an increase of the concentration of oxygen. With a heat treatment at 1100° C. for 30 minutes, the wide absorption peak was sharpened and shifted toward the side having short wave lengths. Thus, the wide absorption peak disappeared. A single absorption peak was observed at the wave length of 9.0$\mu$. With the further increase of $N_2O$, the absorption peaks at the wave lengths of 9.0$\mu$ and 9.3$\mu$ were observed to be in overlapped form.

It is to be inferred from the above-mentioned facts that sufficient oxygen penetrates into the grains of the polycrystalline silicon and that an intermediate compound between $SiO_2$ and SiO exists around the grains. Moreover, it is seen from the above-mentioned facts that the penetration of oxygen into the polycrystalline silicon can be promoted by the heat treatment when the concentration of oxygen is lower. The measurements of visible radiation absorption and ultraviolet ray absorption showed that the absorption edge where the transmissivity is zero, was shifted to the side of the shorter wave length with an increase of the concentration of oxygen. It is inferred from this fact that the polycrystalline silicon layer 7 is not a mere mixture of Si and $SiO_2$, but that oxygen is nearly uniformly distributed throughout the polycrystalline silicon.

The refractive index was measured by an elipsometer. The refractive index of pure polycrystalline silicon ($N_2O/SiH_4=0$) was about 4, and that of $SiO_2$ ($N_2O/SiH_4>40$) was about 1.45, where the concentration of oxygen was 66.7 atomic percent. It was found that the refractive index of the polycrystalline silicon gradually decreased with an increase of the concentration of oxygen in the range from about 4 to about 1.45, as shown in FIG. 5. The polycrystalline silicon layer 7 became similar to the $SiO_2$ layer at concentrations of oxygen over 45 atomic percent. Accordingly, it is not desirable that the concentration of oxygen be over 45 atomic percent. This is also observed from the fact that the resistivity increases with the concentration of oxygen. For example, the resistivity of the polycrystalline silicon layer 7 is $10^7 \sim 10^{11}$ $\Omega$cm. This is between the high resistivity of pure polycrystalline silicon ($3\times 10^6$ $\Omega$cm.) and that of $SiO_2$.

Next, the density of surface states of the interface between the silicon semiconductor substrate and the polycrystalline silicon layer containing oxygen according to this invention was measured. The surface states consist of a fast state, a slow state, a state due to a fixed electric charge on the interface.

A MOS FET, as shown in FIG. 7, was prepared in which a double layer consisting of a polycrystalline silicon layer containing oxygen atoms and a $SiO_2$ layer was used as a gate insulating layer. The surface electric conductivity was measured. It was assumed that a mobility of carriers was not varied with the scattering by mechanical damage of the surface and contaminations thereof. $V_{DS}$-$I_{DS}$ characteristics were measured at the room temperature for obtaining the surface electric conductivity. The results are shown in FIG. 8. In that measurement, the resistivity of the P-type semiconductor substrate used was 5 to 8 $\Omega$cm, the thickness of the polycrystalline silicon layer 25 containing oxygen atoms was 5000 Å, and the thickness of the $SiO_2$ layer 26 was 1500 Å. FIG. 8 shows that currents of carriers induced at the interface between the polycrystalline silicon layer 25 containing oxygen atoms and the semiconductor substrate are under $10^{-5}$ A, and that the currents $I_{DS}$ tend to decrease with the lowering of concentration of oxygen. When a conventional thermal oxidation layer ($SiO_2$ layer), instead of the polycrystalline silicon layer 25, was used under the same condition, the current was about $10^{-3}$ A, and the surface density of fixed positive electric charges in the thermal oxidation layer was about $2\times 10^{11}/cm^2$. Accordingly, the surface density of fixed positive electric charges in the polycrystalline silicon layer 25 is less than $10^{10}/cm^2$, and hence is lower than that in the $SiO_2$ layer. As a result, the influence of the inversion layer induced by the polycrystalline silicon layer containing oxygen atoms is reduced, and the electric characteristics are improved, as below described. From the fact that the surface recombination current on the interface between the silicon semiconductor substrate and the polycrystalline silicon layer, which is decided by the surface states, is as small as that between the silicon semiconductor substrate and the thermal oxidation layer ($SiO_2$ layer), it is deduced that the density of the surface states of the interface between the semiconductor substrate and the polycrystalline silicon layer containing oxygen atoms is less than $10^{10}/(cm^2.eV)$ in the center of the forbidden band.

Next, the electrical characteristics of the transistor constructed as shown in FIG. 2 will be described.

BREAKDOWN VOLTAGE

The breakdown voltage is the highest at an atomic percent of oxygen=0. It tends to decrease with the increase of oxygen. Breakdown voltages are about 500 V at atomic percentages of oxygen of 27.5, 32.5, 36.5. But breakdown voltages are down 20% or about 400 V at atomic percentages of oxygen of 47.5, 55. Also, the breakdown voltage is about 400 V utilizing $SiO_2$ as the passivation layer. High breakdown voltages can be obtained when the polycrystalline silicon layer contains oxygen in the range of 2 to 45 atomic percent. By the combination of the polycrystalline silicon layer and the guard ring region, a higher breakdown voltage of over 10 kV can be obtained.

REVERSE LEAKAGE CURRENT

A reverse bias voltage $V_{CB}$ was applied to the PN-junction 6 between the collector and the base to measure reverse leakage currents $I_{CBO}$ flowing through the collector and the base, and FIG. 9 illustrates the experimental results obtained. It is seen from this data that the reverse leakage current $I_{CBO}$ was greatly reduced when the polycrystalline silicon containing oxygen was used as compared to the case when pure polycrystalline silicon was used. $I_{CBO}$ is the largest at atomic percent of oxygen=0. It was very small in the range where the atomic percent of oxygen was 14 to 36.5.

For example, when the concentration of oxygen was under 2 atomic percent, $I_{CBO}$ was 0.35 μA, at $V_{CB}=350$ V. But when the concentration of oxygen was over 2 atomic percent, especially more than 14 atomic percent, $I_{CBO}$ was 0.01 μA below $V_{CB}$ of 500 volts and was nearly unchanged in the range less than the breakdown voltage.

The reason $I_{CBO}$ was reduced, is considered to be that the mobility of carriers in the polycrystalline silicon is reduced due to the predetermined content of oxygen, or that the resistance of the polycrystalline silicon containing oxygen in a predetermined quantity as above described, is far higher than that of pure polycrystalline silicon.

The resistance becomes large at atomic percent of oxygen $\geq 48.6$, because the characteristics of this polycrystalline silicon layer is the same as $SiO_2$ and an undesirable memory function is induced by positive charges existing in $SiO_2$. This causes an inversion layer to form at the surface of the substrate.

STABILITY OF AMPLIFICATION FACTOR

The amplification $h_{FE}$ was the smallest at atomic percent of oxygen=0, and the largest at atomic percent of oxygen in the range between 48.6 to 66.1. It was intermediate between the smallest and the largest at atomic percent of oxygen in the range between 26.8 to 36.4. It was increased by using hydrogen-annealing at 400° C. The increase was smaller for the transistor according to this invention than it was for conventional transistors using only a $SiO_2$ layer. Accordingly, the transistor has superior $h_{FE}$ stability.

STABILITY AGAINST EXTERNAL ELECTRIC FIELD

At concentrations of oxygen between 2 to 45 atomic percent, oxygen atoms are nearly uniformly distributed in the grains of the polycrystalline silicon. At concentrations of oxygen over 45 percent, the grains are enveloped in $SiO_2$. As a result, the grains function as floating electrodes. For this reason, electrical charges are apt to be trapped when an external voltage is applied. The characteristic of the surface of the polycrystalline silicon layer becomes unstable. As a result, the breakdown voltage or the function as an insulating layer for the semiconductor substrate is lowered.

RELIABILITY

Some polycrystalline silicon layers containing different amounts of oxygen were formed over the junction between the base and collector for passivation. These samples were subjected to reliability tests at 120° C. with voltage of 350 V DC for 1008 hours. After such tests, the $I_{CBO}$ was measured. It is deemed that the device which have $I_{CBO}$ more than 1 μA should be rejected. In these experiments, the percent of rejects using polycrystalline silicon layer containing 45 atomic percent were reduced to 1/7 of those as compared to those using $SiO_2$.

Especially, the percent of rejects using under 35 atomic percent is further reduced to about 1/20 of those using $SiO_2$. Since the coefficient of thermal expansion of the polycrystalline silicon layer is nearly equal to that of the semiconductor substrate, the contact between the polycrystalline silicon layer and the semiconductor substrate is not affected by the thermal distortion and the PN junction is not thermally distorted which prevents deterioration of the characteristics of the transistors.

Nexxt, a MOS IC according to a further embodiment of this invention will be described with reference to FIGS. 10 and 11.

Since the polycrystalline silicon layer containing oxygen in the range of 2 to 45 atomic percent is stable against external electric field, as above described, it can be used for parasitic portions (except gate portions) of a complementary MOS IC.

Figure 10:
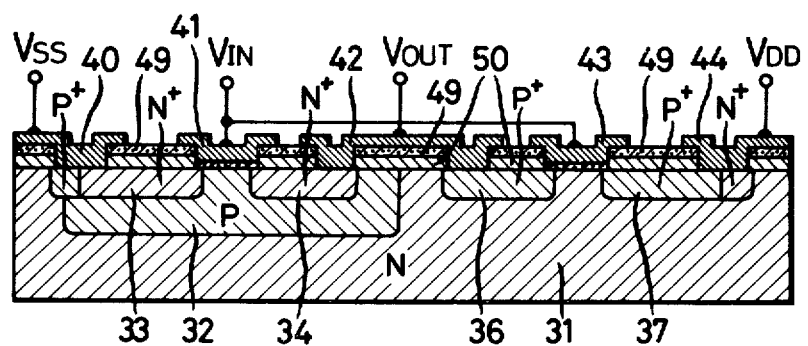
FIG. 10 is a cross sectional view of a portion of an integrated circuit having complementary field effect transistors therein and embodying the present invention.
Figure 11:
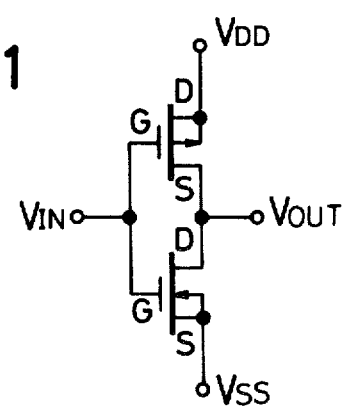
FIG. 11 is a circuit diagram showing an application of the complementary field effect transistors shown in FIG. 10.

In a complementary MOS IC shown in FIG. 10, an N-channel type MOS FET is arranged adjacent to a P-channel type MOS FET in one N-type semiconductor substrate 31. In the N-channel type MOS FET, a P-type semiconductive region 32 is formed in the N-type semiconductor substrate 31. And an N+-type semiconductive source region 33 and an N+-type semiconductive drain region 34 are formed in the P-type semiconductive region 32. On the other hand, in the P-channel type MOS FET, a P-type semiconductive source region 36 and a P-type semiconductive drain region 37 are formed in the N-type semiconductor substrate 31. Electrodes 40, 41, 42, 43 and 44 are deposited on the respective semiconductive regions. Thus, a complementary MOS inverter can be formed. FIG. 11 shows an equivalent circuit of the complementary MOS inverter.

Since a parasitic channel is found in a parasitic portion underlying the electrode 42, in a conventional complementary MOS inverter, a channel stopper region should be formed in the parasitic portion of the conventional complementary MOS inverter. However, since a polycrystalline silicon layer 50 containing oxygen in the range of 2 to 45 atomic percent is formed on the parasitic portion underlying the electrode 42 in the complementary MOS inverter according to this invention, the channel stopper region is not required.

When a $SiO_2$ layer having the thickness of 5000 Å is formed directly onto a silicon substrate having an impurity concentration of $10^{16}/cm^3$, and an electrode is deposited on the $SiO_2$ layer, an inversion layer is induced on the surface of the silicon substrate with the application of a low voltage such as 8 volts to the electrode. In such a case, a channel stopper region is required. On the other hand, when the polycrystalline silicon layer 50 having the thickness of 5000 Å is interposed between the silicon substrate and the $SiO_2$ layer 49, according to this invention, the inversion layer cannot be induced on the surface of the silicon substrate with the application of a higher voltage such as 150 volt. Accordingly, the channel stopper is not required in the complementary MOS inverter according to this invention. The required area can be reduced, and the integration density can be improved.

Although embodiments of this invention have been described, it will be understood that various modifications are possible on the basis of the technical concept of this invention.

For example, the conversion of the conductivity type is possible. After the polycrystalline silicon is deposited on the semiconductor substrate, the polycrystalline silicon layer may be thermally treated at 900° C. in order to obtain more stability. Oxygen atoms can be more uniformly distributed in the grains of polycrystalline silicon. The influence of external electrical fields can be reduced.

Instead of $N_2O$, $NO_2$ or NO may be used to supply oxygen into the polycrystalline silicon layer. The flow rate of $NO_2$ or NO can be controlled to obtain the preferable concentration of oxygen. $O_2$ or $H_2O$ vapor may be used instead of $N_2O$. $N_2O$, NO or $NO_2$ can be more easily controlled to obtain the preferable concentration of oxygen.

Moreover, instead of $SiH_4$, a silicon halide, for example, $SiCl_4$ may be used. However, a higher growth temperature (1100° C.) is required for $SiCl_4$. Accordingly, it is preferable to use $SiH_4$.

Naturally, this invention can be applied to a diode. A polycrystalline silicon layer is formed on the diode so as to cover the exposed portion of the PN junction of the diode. The breakdown voltage of the diode was measured where the concentration of oxygen was 36 atomic percent. The breakdown voltage depended on the depth of the P-type semiconductive region formed on the N-type semiconductor substrate with resistivity of 60 to 80 Ωcm. The breakdown voltage was 640 to 900 V for a depth of 20 to 35μ.

Figure 12:
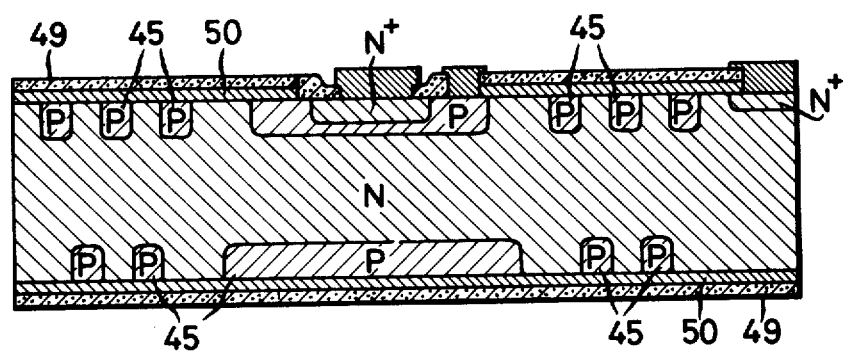
FIGS. 12, 13 and 14 are cross sectional views of further forms of semiconductor devices embodying the present invention.

This invention can be applied also to a semiconductor device in which P-type semiconductive guard ring regions 45 are formed in the upper and lower surface regions of a semiconductor substrate, as shown in FIG. 12. The polycrystalline silicon layers 50 are formed on the upper and lower surfaces of the semiconductor substrate. Further, the $SiO_2$ layers 49 are formed on the polycrystalline silicon layers 50, respectively. The breakdown voltage of the semiconductor device is over 10000 volts.

Figure 13:
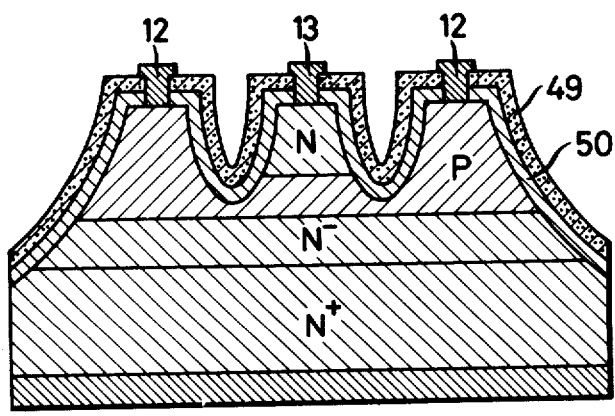
Figure 14:
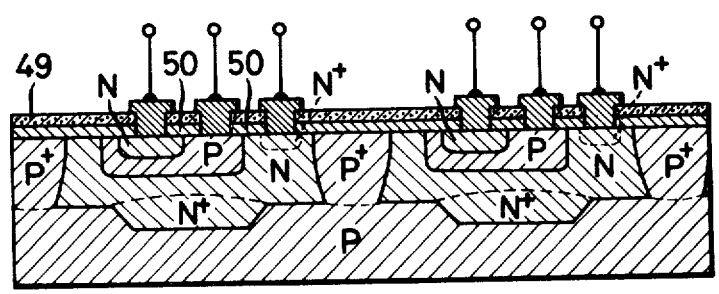

Further, this invention can be applied to a mesa-type semiconductor device, as shown in FIG. 13. It also can be applied to a conventional integrated circuit comprising two transistors separated from each other by a P-type semiconductive region, as shown in FIG. 14, for which the polycrystalline silicon layer 50 is used as a passivating layer.

By using only a polycrystalline silicon layer according to this invention, or using the combination of the polycrystalline silicon layer, a $SiO_2$ layer and another polycrystalline silicon layer containing nitrogen over 10 atomic percent, contaminative ions and moisture are prevented from entering into the semiconductor device from external, and moreover, the influence of electrical fields due to ions can be reduced. Accordingly, instead of an expensive package which is used for a conventional semiconductor device, an inexpensive mold resin normally used for a capacitor can be used for a semiconductor device according to this invention. Moreover, the amount of mold resin required for the semiconductor device can be very small.

The semiconductor device is hard to be contaminated and deteriorated in the manufacturing process. It can be simply manufactured or fabricated. The yield rate can be improved. Accordingly, the cost can be reduced, and the semiconductor device can be small-sized.

Since the polycrystalline silicon layer containing oxygen atoms according to this invention has not only the advantage of passivating layer, but also of a non-reflecting coating layer, it can be used as a passivating layer for a light-detecting element such as a photo-cell. In such a case, a desirable oxygen concentration can be selected in accordance with the characteristics of incident light, with reference to the relationship between the refractive index and the oxygen concentration, as shown in FIG. 5.

Since the polycrystalline silicon layer containing oxygen atoms is semi-insulating, carriers do not stay in deep traps for a long time, but they get out from the traps very quickly. Little electric charges are induced and the number of the surface states is not increased, by radioactive rays. Accordingly, the semiconductor device using the polycrystalline silicon layer according to this invention is resistive to radioactive rays. It is little damaged by radioactive rays.

It will be apparent to those skilled in the art that many modifications and variations may be effected without departing from the spirit and scope of the novel concepts of the present invention.

We claim as our invention:

1. An MOS inverter including an N-channel MOS-FET and a P-channel MOS-FET which comprises a monocrystalline silicon semiconductor substrate of N-type impurity having a planar face, a P-type island formed in said planar face, first and second N+ type laterally spaced regions formed in the planar face of said P-type island, first and second P+ type regions formed in the planar face of said substrate laterally spaced from said N+ type regions, a third P+ type region in said planar face of said substrate extending down to the PN junction between said P-type region and said N-type substrate which lies near the outer side edge of the substrate; a third N+ type region extending down from the planar face of said substrate into contact with said substrate, an oxygen doped polycrystalline semiconductor layer interfaced with the planar face of said substrate including said P+ and N+ regions, the oxygen content of said polycrystalline layer being between 2 and 45 atomic percent, the thickness of said polycrystalline layer over the substrate region lying between said first and second P+ regions and the thickness of said polycrystalline layer over the region of said first P-type region lying between said first and second N+ regions being substantially thinner than that lying over the remaining portions of the planar face, a layer of an insulating semiconductor material overlying the thicker portions of said polycrystalline layer, and in two regions in contact with said P-type island and said N-type substrate, a pair of gate electrodes extending down into complete surface contact with said two regions of insulating material, said gate electrodes being externally connected together, a source electrode extending through said insulating layer and said polycrystalline layer into contact with said first N+ region and said third P+ region, a drain electrode extending through said insulating layer and said polycrystalline layer into contact with said second P+ region and said third N+ region, a single contact extending through said insulating layers and said polycrystalline layers at two places into contact with said second N+ region and said first P+ region, the density of the surface states of the interface between said polycrystalline layer and said substrate being less than $10^{10}$ states/(cm$^2$.eV) in the center of the forbidden band, the electrical property of said layer reducing the influence of an electrical field.

2. An MOS inverter including, an N-channel MOS-FET and a P-channel MOS-FET which comprises a monocrystalline silicon semiconductor substrate of N-type impurity having a planar face, a P-type island formed in said planar face, first and second N+ type laterally spaced regions formed in the planar face of said P-type island, first and second P+ type regions formed in the planar face of said substrate laterally spaced from said N+ type regions, a third P+ type region in said planar face of said substrate extending down to the PN junction between said P-type region and said N-type substrate which lies near the outer side edge of the substrate; a thire N+ type region extending down from the planar face of said substrate into contact with said substrate, an oxygen doped polycrystalline semiconductor layer interfaced with the planar face of said substrate including said P+ and N+ regions, the oxygen content of said polycrystalline layer being between 2 and 45 atomic percent, the thickness of said polycrystalline layer over the substrate region lying between said first and second P+ regions and the thickness of said polycrystalline layer over the region of said first P-type region lying between said first and second N+ regions being substantially thinner than that lying over the remaining portions of the planar face, a layer of an insulating semiconductor material overlying the thicker portions of said polycrystalline layer and in two regions in contact with said P-type island and said N-type substrate, a pair of gate electrodes extending down into complete surface contact with said two regions of insulating material, said gate electrodes being externally connected together, a source electrode extending through said insulating layer and said polycrystalline layer into contact with said first N+ region and said third P+ region, a drain electrode extending through said insulating layer and said polycrystalline layer into contact with said second P+ region and said third N+ region, a single contact extending through said insulating layers and said polycrystalline layers at two placed into contact with said second N+ region and said first P+ region, the surface density of fixed charges being less than $10^{10}/cm^2$ in said polycrystalline layer, the electrical property of said layer reducing the influence of an electrical field.

* * * * *